United States Patent [19]
Kim

[11] Patent Number: 6,043,841
[45] Date of Patent: Mar. 28, 2000

[54] APPARATUS FOR OBSERVING ARC OF LAMP

[75] Inventor: Yong-ki Kim, Sungnam, Rep. of Korea

[73] Assignee: Samsung Aerospace Industries, Ltd., Suwon-city, Rep. of Korea

[21] Appl. No.: 09/026,975

[22] Filed: Feb. 20, 1998

[30] Foreign Application Priority Data

Feb. 21, 1997 [KR] Rep. of Korea .......................... 97-2698

[51] Int. Cl.⁷ .................................................. H04N 7/18

[52] U.S. Cl. .............................................. 348/92; 348/125

[58] Field of Search .................................. 348/61, 82, 86, 348/92, 125, 131

[56] References Cited

U.S. PATENT DOCUMENTS

| | | | |
|---|---|---|---|
| 4,492,469 | 1/1985 | Fujimori | 356/361 |
| 5,209,689 | 5/1993 | Griffin | 445/27 |

FOREIGN PATENT DOCUMENTS 10-239212  9/1998  Japan ............................. G01M 11/00

*Primary Examiner*—Bryan Tung
*Attorney, Agent, or Firm*—Howrey & Simon

[57] ABSTRACT

A lamp arc observing apparatus includes a lens unit installed in the path of light emitted from a lamp, a camera for viewing the image of the electrodes of the lamp through the lens unit, and a light intensity controlling device installed between the lens unit and the camera for controlling the intensity of light incident on the camera so that the camera can capture the image of the electrodes of the lamp.

8 Claims, 2 Drawing Sheets

APPARATUS FOR OBSERVING ARC OF LAMP

BACKGROUND OF THE INVENTION

1. Field of the Invention

The present invention relates to an apparatus for observing an arc of a lamp, and more particularly, to an apparatus for observing an arc of a lamp by which it is possible to easily observe the degree to which a lamp electrode is damaged.

2. Description of Related Art

An exposing apparatus is used to manufacture semiconductor devices which are used in various electronic equipment and flat panel displays such as a liquid crystal display. The exposing apparatus is provided with a lamp for emitting light by an arc discharge and a lamp arc observing apparatus for observing whether the lamp is damaged.

Referring to FIG. 1 showing a conventional lamp arc observing apparatus, a lamp 20 and a parabolic reflective mirror 30 for reflecting and focusing the light emitted from the lamp 20 are installed in a frame 10. An arc discharges when power is applied to a pair of electrodes 20a and 20b of the lamp 20. The light emitted by the arc discharge is reflected by the parabolic reflective mirror 30 and proceeds to a main mirror 40. The light reflects from the main mirror 40 and travels through an opening 10b of the frame 10 and is used as desired.

As the lamp 20 is used for a long time, the electrodes 20a and 20b become damaged or abraded due to the high operating temperatures and the gap distance between the electrodes 20a and 20b increases. Damage to the electrodes 20a and 20b can be observed through a first observing hole 30a and a second observing hole 10a respectively formed in the parabolic reflective mirror 30 and the frame 10.

It is very difficult to form the first observing hole 30a without damaging the parabolic reflective mirror 30 since the parabolic reflective mirror 30 is formed of glass-like material. Also, the efficiency of light use of the lamp 20 suffers since light leaks through the first observing hole 30a.

SUMMARY OF THE INVENTION

It is an object of the present invention to provide an apparatus for observing the arc of a lamp that enables easy observation of the damage and abrasion of lamp electrodes and that uses the light of the lamp more efficiently.

To achieve the above object, a lamp arc observing apparatus is provided which includes a lens unit installed in the path of light emitted from a lamp, a camera for capturing an image of the electrodes of the lamp through the lens unit, and a light intensity controlling device installed between the lens unit and the camera for controlling the intensity of light incident on the camera so that the camera can capture the image of the electrodes of the lamp.

A projecting plate onto which light emitted from a lamp through the lens unit is projected to thereby form an image of the electrodes of the lamp is installed between the lens unit and the camera. The camera captures the image of the electrodes formed on the projecting plate.

The lens unit includes a convergent lens through which some of the light emitted from the lamp passes, and at least one mirror for reflecting the light passed through the convergent lens to the projecting plate.

Also, in the frame, a magnifier for magnifying the image of the electrodes is preferably formed on the projecting plate so that the state of the electrodes can be checked visually.

The light intensity controlling device is preferably a filter for attenuating the intensity of light.

BRIEF DESCRIPTION OF THE DRAWING(S)

The above object and advantages of the present invention will become more apparent by describing in detail a preferred embodiment thereof with reference to the attached drawings in which:

FIG. 1 is a schematic sectional view of a conventional lamp arc observing apparatus; and FIG. 2 is a schematic sectional view of a lamp arc observing apparatus according to the present invention.

DESCRIPTION OF THE PREFERRED EMBODIMENT(S)

Figure 1:
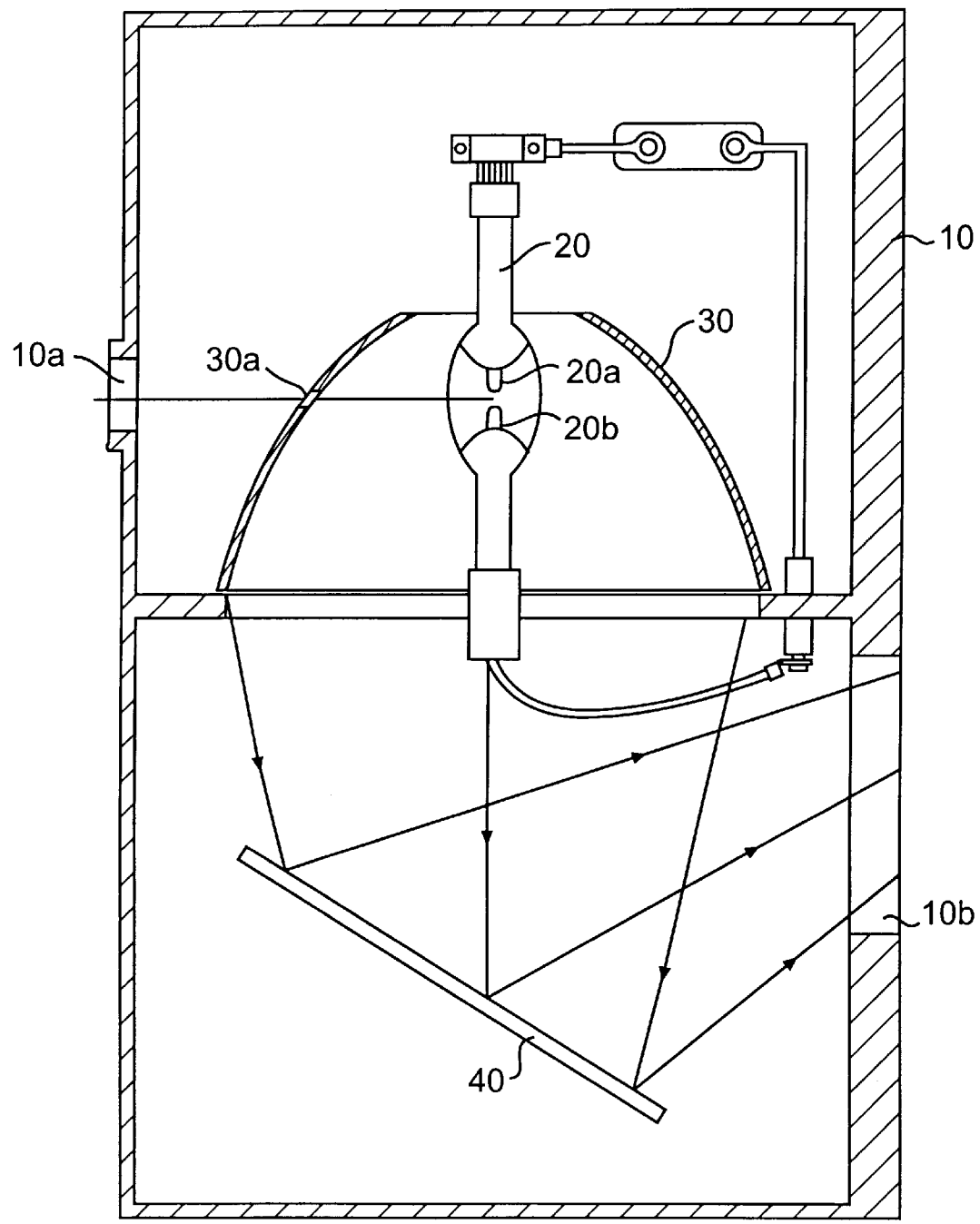
Figure 2:
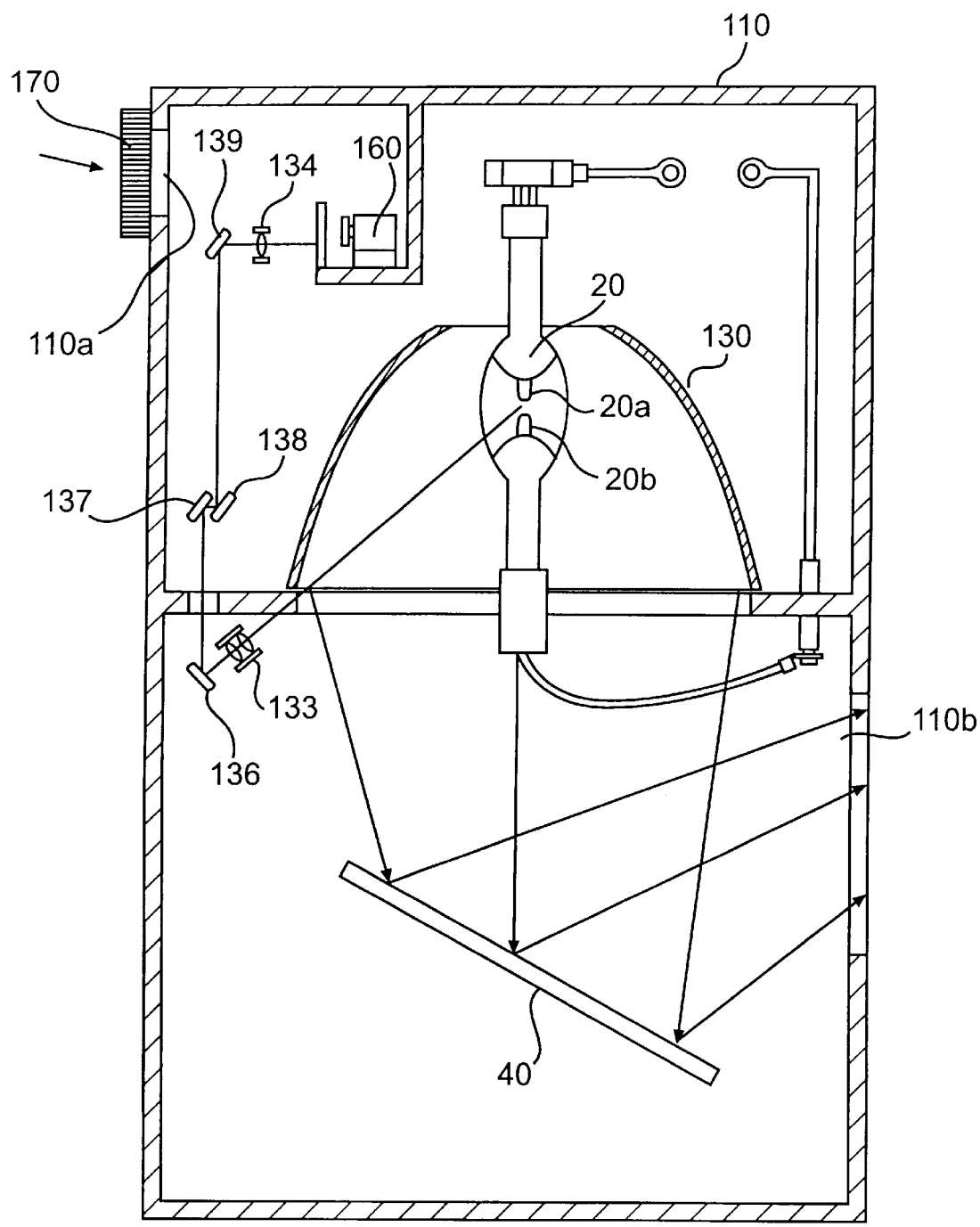

FIG. 2 shows a lamp arc observing apparatus according to the present invention. Here, reference characters identical to those of FIG. 1 denote identical members for performing identical functions.

As shown in FIG. 2, a parabolic reflective mirror 130 for reflecting and focusing light emitted from the lamp 20 is installed above the lamp 20 in a frame 110.

According to the present invention, a lens unit for viewing the state of the electrodes 20a and 20b is installed in the frame 110. The lens unit includes a convergent lens 133 through which some of the light emitted from the lamp 20 passes and a plurality of mirrors 136, 137, 138, and 139 for reflecting the light which passes through the convergent lens 133. Most of the light emitted from the electrodes 20a and 20b of the lamp 20 due to the arc discharge is reflected by the main mirror 40 through an opening 110b formed in the frame 110. This light is used for desired purposes such as an exposing process.

Also, some of the light emitted from the lamp 20 is converged and reflected by the convergent lens 133 and the plurality of mirrors 136, 137, 138, and 139 and proceeds to a light intensity controlling device. In FIG. 2, projecting plate 150 is the light intensity controlling means.

A focusing lens 134 for focusing the light can be installed in front of the projecting plate 150. Here, an image showing the state of the electrodes 20a and 20b is projected onto the projecting plate 150. The projecting plate 150 is preferably formed of a semi-transparent material which allows some of the light to pass through.

A CCD camera 160 is installed behind the projecting plate 150 to capture the image of the electrodes projected onto the projecting plate 150. The CCD camera 160 is electrically connected to a monitor (not shown). Accordingly, the state of the electrodes 20a and 20b whose images are formed on the projecting plate 150 can be observed on the monitor.

A filter for attenuating the intensity of light can be used as the light intensity controlling device instead of the projecting plate 150. In this case, the CCD camera 160 can directly view the image of the electrodes 20a and 20b of the lamp through the filter.

Also, a magnifier 170 is installed in the frame 110 so as to enable observation of the image of the electrodes projected on the projecting plate 150 without using the CCD camera 160. The magnifier 170 includes a plurality of lenses (not shown).

As mentioned above, the lamp arc observing apparatus according to the present invention enables an easy determination of whether the lamp must be changed by checking the electrode damage visually on the monitor connected to the CCD camera or through the magnifier. Also, it is not necessary to form an observing hole in the parabolic reflective mirror, as in the conventional technology, to observe the electrode of the lamp. Therefore, it is possible to reduce the loss of light efficiency caused by the observing hole.

What is claimed is:

1. A lamp arc observing apparatus, comprising:
   a lens unit installed in the path of light emitted from a lamp;
   a camera for capturing an image of the electrodes of the lamp through the lens unit; and
   a light intensity controlling device installed between the lens unit and the camera for controlling the intensity of light incident on the camera.

2. The lamp arc observing apparatus of claim 1, wherein said light intensity controlling device includes a projecting plate onto which light emitted from a lamp through the lens unit is projected to thereby form an image of electrodes of the lamp.

3. The lamp arc observing apparatus of claim 2, wherein said camera captures the image of the electrodes formed on said projecting plate.

4. The lamp arc observing apparatus of claim 2, wherein the lens unit comprises:
   a convergent lens through which some of the light emitted from the lamp passes; and
   at least one mirror for reflecting the light passed through the convergent lens to the projecting plate.

5. The lamp arc observing apparatus of any of claims 2–4, wherein a focusing lens for focusing the light is installed in front of the projecting plate.

6. The lamp arc observing apparatus of any of claims 2–4, wherein the projecting plate is formed of a semi-transparent material which allows light to pass therethrough.

7. The lamp arc observing apparatus of any of claims 2–4, wherein a magnifier is installed in a frame of said apparatus to magnify the image of the electrodes formed on the projecting plate so that the state of the electrodes can be checked visually.

8. The lamp arc observing apparatus of claim 1, wherein the light intensity controlling device includes a filter for attenuating the intensity of light.

* * * * *